United States Patent [19]

Olson et al.

[11] Patent Number: 4,933,910

[45] Date of Patent: Jun. 12, 1990

[54] METHOD FOR IMPROVING THE PAGE HIT RATIO OF A PAGE MODE MAIN MEMORY SYSTEM

[75] Inventors: Anthony M. Olson, Stevensville; Babu Rajaram; Thomas N. Robinson, both of St. Joseph, all of Mich.

[73] Assignee: Zenith Data Systems Corporation, Mt. Prospect, Ill.

[21] Appl. No.: 215,652

[22] Filed: Jul. 6, 1988

[51] Int. Cl.⁵ .............................................. G11C 8/00
[52] U.S. Cl. .............................. 365/238.5; 365/233; 365/230.02
[58] Field of Search ................... 365/233, 230.02, 193, 365/194, 238.5

[56] References Cited

U.S. PATENT DOCUMENTS

| | | | |
|---|---|---|---|
| 4,535,428 | 8/1985 | Furman | 365/230 |
| 4,596,004 | 6/1986 | Kaufman | 365/233 |
| 4,750,839 | 6/1988 | Wang et al. | 365/233 |
| 4,792,929 | 12/1988 | Olson et al. | 365/233 |

Primary Examiner—Joseph A. Popek

[57] ABSTRACT

Page mode memory access is enabled despite an immediately previous idle cycle. A row address strobe signal is maintained active during an idle cycle so that if a page hit is detected on a subsequent memory cycle, all that is needed to read or write to memory is a column address strobe signal which can be provided via a page mode access. In this manner, memory speed is enhanced because a conventional access is not required on the first memory cycle following one or more idle cycles.

3 Claims, 3 Drawing Sheets

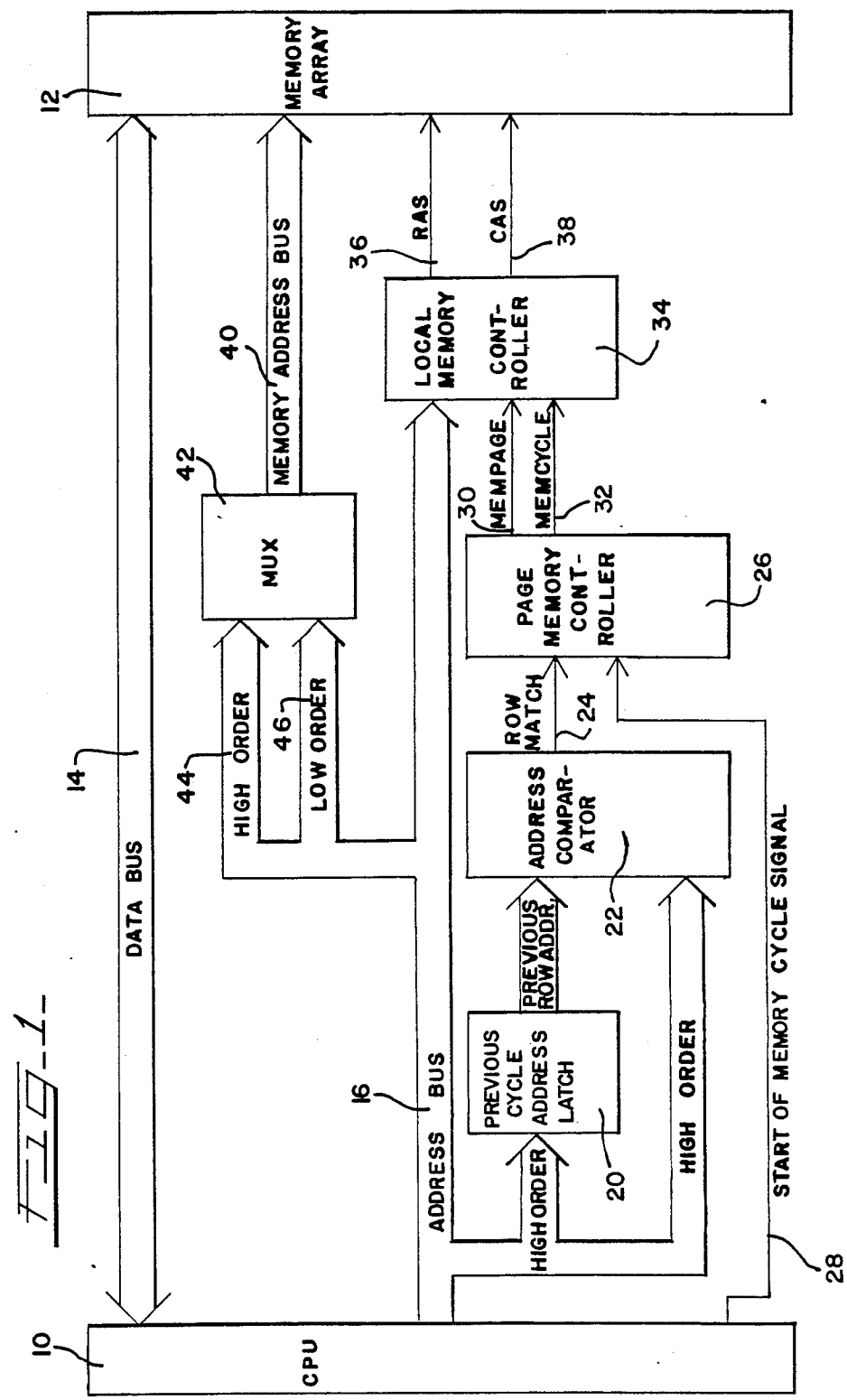

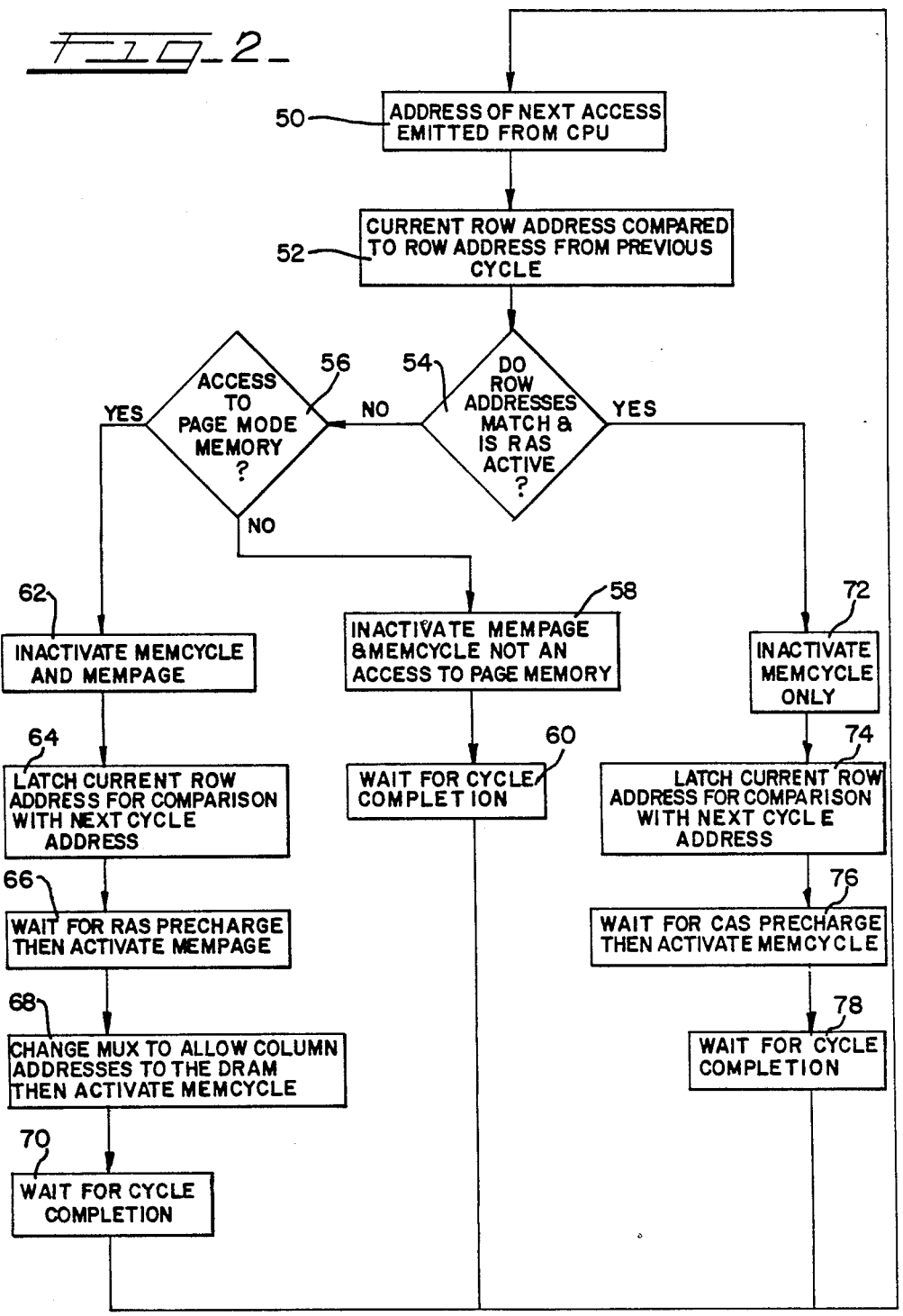

4,933,910

METHOD FOR IMPROVING THE PAGE HIT RATIO OF A PAGE MODE MAIN MEMORY SYSTEM

BACKGROUND OF THE INVENTION

The present invention relates generally to methods of accessing main memory in a computer system. More particularly, the present invention relates to a page mode method of accessing main memory. Specifically, the present invention provides a method whereby a page mode memory access can occur despite an immediately previous idle cycle.

In high speed computer systems, main memory is used to store all information required by the current working set. It has been found that accessing main memory information in a page mode fashion can partially overcome the typical slow access speed of main memory. The reason for this is that a page mode access enjoys a shorter cycle time than a conventional memory access, thus allowing the memory system to more quickly respond to a CPU request.

There are specific limitations on the ability to make a page mode access at any given time. When a page mode access cannot occur, then a slower conventional access must be used. One of such limitations has been the requirement that the first main memory access cycle following one or more idle cycles be carried out via a conventional memory access. The reason for this has been that when an idle cycle occurs, the CPU is forced out of its pipelined addressing mode. In order to then again begin a series of memory accesses, a conventional access must first be forced. Forcing a conventional access at all times following an idle cycle in this manner causes the system to suffer a performance penalty.

Accordingly, it is a principal object of the present invention to provide an improved memory access method that generally overcomes the deficiencies of the prior art.

It is a more specific object of the present invention to provide a method whereby the first main memory access following one or more idle cycles may be carried out in a page mode fashion.

It is a related object to reduce the likelihood of a forced conventional access so as to improve system performance.

BRIEF DESCRIPTION OF THE DRAWINGS

The appended claims set forth the features of the present invention with particularity. The invention, together with its objects and advantages, may be best understood from the following detailed description taken in conjunction with the accompanying drawings of which:

FIG. 1 is a general block diagram illustrating a computer system having the capability to make page mode main memory accesses;

FIG. 2 is a flow chart representing a method of page mode main memory access which could be used with the computer system of FIG. 1;

DETAILED DESCRIPTION OF THE PREFERRED EMBODIMENT

Figure 4:
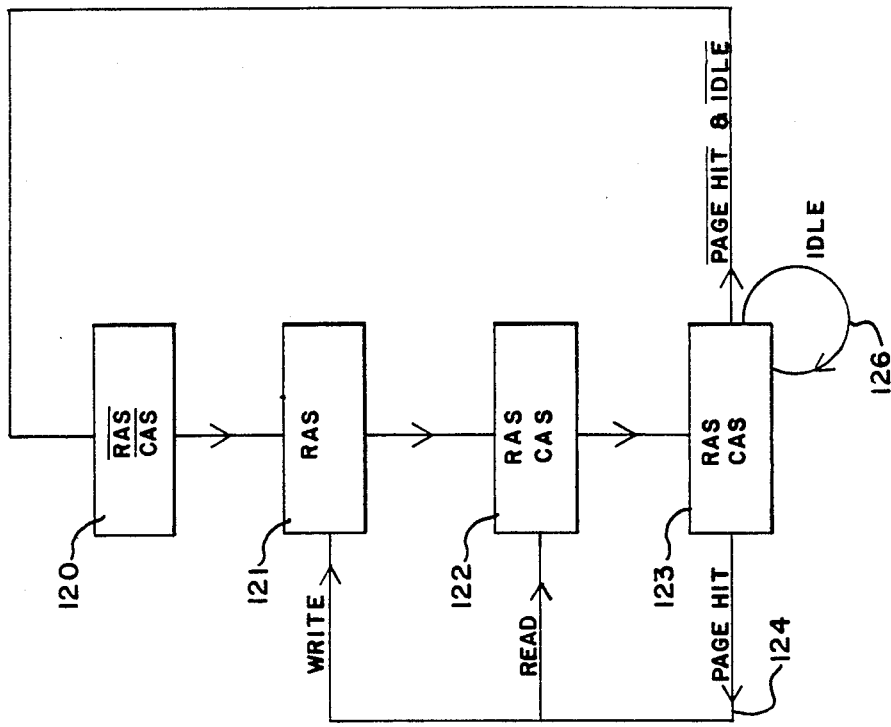
FIG. 4 is a state diagram representing the method of the present invention of carrying out the method of page mode memory access of FIG. 2.

The present invention accomplishes the above and other objects through a method of page mode main memory access which takes into account whether the current cycle is an idle cycle. If it is determined that the current cycle is an idle cycle, then the state of certain page mode hardware is preserved during the idle cycle. By preserving the state of page mode hardware during the idle cycle, any subsequent main memory access may be carried out via the page mode.

Referring now to FIG. 1, a computer system which would benefit from the method of the present invention is illustrated. A CPU 10 communicates with a memory array 12 via a data bus 14 and an address bus 16. Memory array 12 may be main memory of the computer system consisting of dynamic random access memory (DRAM) devices. Memory array 12 is adapted to hold all of the information required by the CPU 10 for the current working set.

The computer system shown in FIG. 1 has the capability to access memory array 12 in either a conventional manner or in a page mode fashion. Memory array 12 is architecturally organized as an array of rows and columns wherein any element of memory array 12 can be identified by selecting a particular row and a particular column. In terms of address information, the high order address information found on address bus 16 is used to select a particular row, and the low order address information likewise corresponds to a particular column. A latch 20 is provided to receive high order address lines of address bus 16 and temporarily store the information present on those lines during a main memory access cycle. This latched information represents the row selected during that memory access cycle. An address comparator 22 compares current high order address, or row, information to the latched row information of the previous memory cycle and outputs, at 24, whether a match exists. A page memory controller 26 responds to the output 24 of address comparator 22 and a signal 28 generated by CPU 10 indicating the start of a memory access, and outputs memory control signals MEMPAGE 30 and MEMCYCLE 32. A local memory controller 34 is then provided to receive MEMPAGE 30 and MEMCYCLE 32 and generate in response thereto a row address strobe (RAS) 36 signal and a column address strobe (CAS) 38 signal.

RAS 36 goes active when the information on memory address bus 40 corresponds to the high order, or row, address information of address bus 16 during a memory access cycle. CAS 38 goes active when the information on memory address bus 40 corresponds to the low order, or column, address information of address bus 16 during a memory access cycle. Multiplexer 42 is provided so that the information on memory address bus 40 can be switched between either high order address, or row, information, shown at 44, or low order address, or column, information, shown at 46. When RAS 36 is activated, it strobes row address information present on the memory address bus 40 into memory array 12. After this, multiplexer 42 is switched so that column address information 46 is placed on the memory address bus 40. Once the column information is valid, CAS 38 is activated to strobe the column address information into memory array 12. In this way, any element of memory array 12 can be accessed via its unique row and column combination.

Referring now to FIG. 2, the sequence of events during a memory access cycle of the computer system of FIG. 1 will be described. At block 50, the CPU emits the address of the requested memory access on the address bus. At block 52, the high order, or row, information of this address is compared to the high order, or row, information of the previous memory cycle. At block 54, a decision is made as to whether the row addresses match and RAS is active. RAS being active indicates that the current cycle is an access to main memory, and an address match indicates that the row selected during the previous cycle is the same as the row now being selected in the current cycle.

If the decision at block 54 is negative, a page mode access is impossible. Another decision at block 56 is then made as to whether the current cycle is an access to main memory capable of page mode access. If the decision at block 56 is negative, this means that the current access is not to page mode memory but to some other memory device. In such a case, as shown at block 58, the page memory controller inactivates both MEMPAGE and MEMCYCLE, which causes the local memory controller to inactivate both RAS and CAS thereby preventing any response by the main memory array. After this, at block 60, the system waits for completion of the access cycle before returning to block 50.

If the decision at block 56 is affirmative, a conventional access to main memory must be executed. This is accomplished by first inactivating MEMPAGE and MEMCYCLE, at block 62, which causes the local memory controller to inactivate both RAS and CAS. Next, at block 64, the latch laches current row address information for future comparison with the row address information of the next memory access cycle. Then, at block 66, the system must wait for a defined amount of time, known as the RAS precharge time. After the RAS precharge time has elapsed, the page memory controller activates MEMPAGE which in turn causes RAS to go active strobing the row address information into the memory array. Next, at block 68, the multiplexer is switched so that the column address information appears on the memory address bus, and after it becomes valid, the page memory controller activates MEMCYCLE, which in turn causes CAS to go active strobing the column address information into the memory array. After this, the memory array has both the row information and the column information needed to access the requested memory element, and at block 70, the system waits until the memory array responds and the cycle is completed before returning to block 50.

If the decision at block 54 is affirmative, a page mode memory access is possible. In such a case, the memory array already has the row address information from the previous cycle since the row information of the previous cycle and the current cycle is the same. Thus, the only additional information needed to identify the requested memory element is the column information. At block 72, the page memory controller inactivates MEMCYCLE which causes CAS to go inactive. RAS remains active at this time. Next, at block 74, the latch latches current row information for future comparison with the row address information of the next memory access cycle. Then, at block 76, the system must wait for a definite amount of time, known as the CAS precharge time, for the column address information on the memory address bus supplied by the multiplexer to become valid. After the CAS precharge time has elapsed, the page memory controller activates MEMCYCLE which in turn causes CAS to go active strobing the column address information into the memory array. After this, the memory array has both the row information and the column information needed to access the requested memory element, and at block 78, the system waits until the memory array responds and the cycle is completed before returning to block 50.

Figure 3:
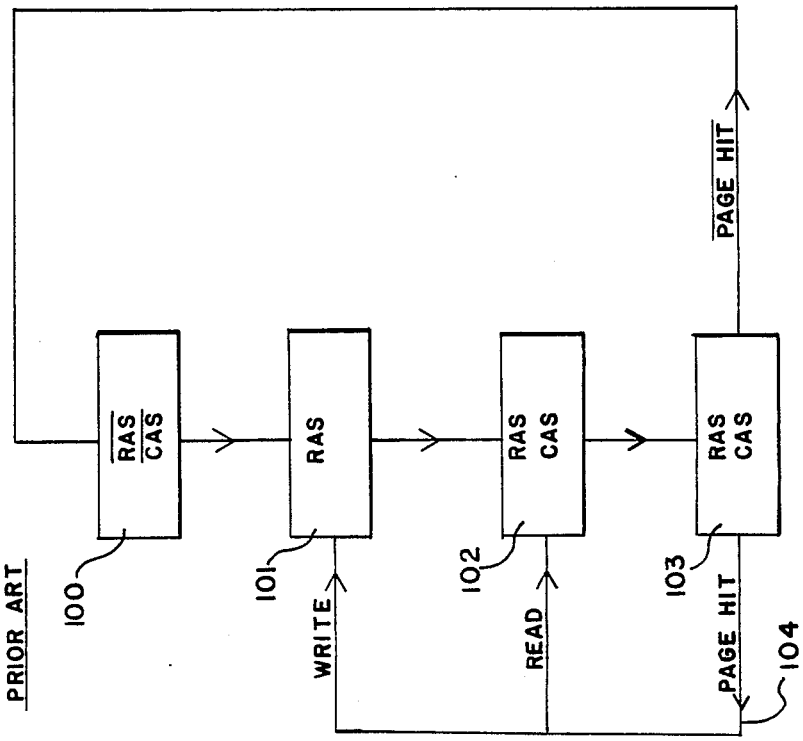
FIG. 3 is a state diagram representing a prior art method of carrying out the page mode main memory access method of FIG. 2.

Referring to FIG. 3, a state diagram illustrates a prior art method of carrying out the page mode method of FIG. 2. After the computer powers up, the state machine enters state 100 and remains there until a memory cycle occurs. At state 100, RAS and CAS are held inactive. Once a memory cycle begins, the state machine proceeds to state 101 where RAS becomes active. It then proceeds to state 102 where CAS becomes active in addition to RAS being active. Finally, state 103 is reached where RAS and CAS remain active. The state machine remains in state 103 until the next cycle is initiated.

If a subsequent cycle is a memory access cycle and also happens to be a "page hit" (i.e., if the row address emitted by the CPU during this cycle is the same as the row address emitted by the CPU during the most recent previous memory access cycle), then control passes to state 101 for a write cycle or to state 102 for a read cycle. Transition 104 causes CAS to go inactive, but at the first clock pulse after control passes to state 101 for a write cycle or state 102 for a read cycle, CAS again goes active. The period during which CAS is inactive is the CAS precharge time described above. At this point, the state machine progresses as before to state 103 where it again remains until the next cycle is initiated.

If the subsequent cycle is any type of cycle other than a page hit, including an idle cycle, then control passes to state 100 where RAS and CAS become inactive, and control remains in state 100 until another memory cycle occurs. Once in state 100, the next memory cycle must be carried out via a slow conventional access. Thus, it is advantageous, in terms of speed, to avoid returning to state 100 if possible, because as can be understood, a page mode memory access can be significantly shorter than a conventional access by virtue of there being no need to wait for the RAS precharge time to elapse. When, as is often the case, an idle cycle occurs with the prior art method of page mode main memory access as described above, control returns to state 100, and the first main memory access following one or more of such idle cycles must be a conventional access. The reason for this has been that an idle cycle forces the CPU out of its pipelined addressing mode, and in order to then again begin accessing memory, a conventional access must be forced.

According to the method of the invention, the occurrence of an idle cycle will not transfer control to state 100 of FIG. 3 but will result in control remaining in state 103 so that if a subsequent cycle happens to be a page hit, then quick page mode accessing can occur. In other words, idle cycles are treated as extensions of a previous cycle. Thus, if a subsequent cycle happens to access the same page, or row, of memory as the most recent cycle previous to the idle cycle or cycles, it can be carried out in page mode fashion.

The present method is implemented in a manner whereby memory control logic keeps RAS active during idle cycles. Thus, if a page hit is detected on a subsequent cycle, a page mode access is performed since RAS is already active and all that is needed to read or write to the memory is CAS. If any cycle other than a page hit is detected, RAS goes inactive and the requested operation is executed in the usual manner.

FIG. 4 illustrates a state diagram of the method of the present invention. The state machine remains in state 120 until a memory cycle occurs. At state 120, RAS and CAS are held inactive. Upon initiation of a memory cycle, control passes to state 121 where RAS becomes active. The machine then proceeds to state 122 where CAS becomes active in addition to RAS being active. State 123 is finally reached where RAS and CAS remain active and where the machine remains until the next cycle is initiated.

As before, if a subsequent cycle happens to be a page hit, control passes to state 121 for a write cycle or to state 122 for a read cycle. Transition 124 causes CAS to go inactive which is the beginning of CAS precharge, but CAS again goes active at the next clock pulse, strobing column address information into memory. The state machine again progresses to state 123 where it again waits until a subsequent cycle begins.

If a subsequent cycle is not a page hit, control only returns to state 120 if that cycle is also not an idle cycle, as shown at transition 125. If it is an idle cycle, control remains at state 123 until the next cycle is initiated, as shown at transition 126. In this manner, an idle cycle does not return control to state 120 where a conventional access must next be forced, but rather leaves control at state 123 where a subsequent page mode access is still possible.

A method for allowing a page mode access to occur immediately following one or more idle cycles is disclosed. Pursuant to the invention, an idle cycle will no longer force a slow conventional access on the next memory cycle. RAS is maintained active during idle cycles despite the CPU being forced out of its pipelined addressing mode. In this way, a subsequent page mode access is possible. Unlike other cycles, such as direct memory access cycles or interrupt cycles, which may cause the contents of the previous cycle row address latch to become mismatched with the actual row address information strobed into memory, idle cycles do not have this effect. Thus, by allowing a page mode access to occur subsequent to an idle cycle, according to the method of the present invention, system performance can be improved without the risk of malfunction from the possibility of a mismatch as described above.

It will be appreciated by those skilled in the art that modifications to the foregoing preferred embodiment may be made in various aspects. The present invention is set forth with particularity in the appended claims. It is deemed that the spirit and scope of that invention encompasses such modifications and alterations to the preferred embodiment as would be apparent to one of ordinary skill in the art and familiar with the teaching of the present invention.

We claim:

1. A page mode method for accessing a main memory array in a computer system in response to the initiation of a memory cycle comprising:
   strobing row address information into said memory array;
   strobing column address information into said memory array;
   waiting until a subsequent cycle begins;
   repeating said steps of strobing row address information, strobing column address information and waiting if said subsequent cycle is both not a page hit and not an idle cycle;
   repeating said steps of strobing column address information and waiting if said subsequent cycle is a page hit; and
   repeating said step of waiting if said subsequent cycle is an idle cycle.

2. A page mode method for accessing a main memory array in a computer system in response to the initiation of a memory cycle, as recited in claim 1, wherein said step of repeating said step of waiting comprises maintaining a row address strobe signal active during said idle cycle.

3. A method for performing a page mode memory access during a current access cycle immediately following an idle cycle in a computer system having a main memory array comprising:
   comparing row address information emitted by a central processing unit during said current access cycle with row address information emitted by said central processing unit during a most recent previous memory access cycle prior to said idle cycle; and
   accessing said memory array in a page mode fashion if said comparison yields a match.

* * * * *